(12) United States Patent
Kuo et al.

(10) Patent No.: US 8,546,890 B2
(45) Date of Patent: Oct. 1, 2013

(54) INVERTER STRUCTURE AND METHOD FOR FABRICATING THE SAME

(75) Inventors: Chien-Li Kuo, Hsinchu (TW); Chia-Chun Sun, Taipei County (TW); Chuan-Hsien Fu, Taipei County (TW); Chun-Liang Hou, Hsinchu County (TW); Yun-San Huang, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 464 days.

(21) Appl. No.: 12/324,860

(22) Filed: Nov. 27, 2008

(65) Prior Publication Data

US 2010/0127337 A1    May 27, 2010

(51) Int. Cl.
*H01L 21/8238* (2006.01)
*H01L 21/8244* (2006.01)
*H01L 27/092* (2006.01)

(52) U.S. Cl.
USPC ............................ 257/393; 257/338; 257/369

(58) Field of Classification Search
USPC .......................................................... 257/393
See application file for complete search history.

(56) References Cited

U.S. PATENT DOCUMENTS

| | | | |
|---|---|---|---|
| 6,333,527 B2 * | 12/2001 | Kim | 257/288 |
| 6,583,518 B2 | 6/2003 | Trivedi | |
| 7,166,896 B2 | 1/2007 | Tang | |
| 2003/0042628 A1 * | 3/2003 | Trivedi et al. | 257/903 |
| 2007/0161142 A1 * | 7/2007 | Mouli et al. | 438/57 |
| 2007/0181958 A1 * | 8/2007 | Jung | 257/393 |
| 2009/0166758 A1 * | 7/2009 | Yang et al. | 257/393 |

* cited by examiner

*Primary Examiner* — Ha Tran T Nguyen
*Assistant Examiner* — Raj R Gupta
(74) *Attorney, Agent, or Firm* — Winston Hsu; Scott Margo

(57) ABSTRACT

An inverter structure is disclosed. The inverter structure includes an NMOS transistor and a PMOS transistor. Preferably, the NMOS transistor includes an n-type gate electrode and an n-type source/drain region, and the PMOS transistor includes a p-type gate electrode and a p-type source/drain region. Specifically, the n-type gate electrode and the p-type gate electrode are physically separated and electrically connected by a conductive contact.

8 Claims, 4 Drawing Sheets

INVERTER STRUCTURE AND METHOD FOR FABRICATING THE SAME

BACKGROUND OF THE INVENTION

1. Field of the Invention

The invention relates to an inverter, and more particular to an inverter structure disposed in a SRAM.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

Please refer to FIG. 1, which shows a circuit diagram of typical six-transistors SRAM (6T-SRAM) 10. The 6T-SRAM cell 10 comprises pull-up transistors 12 and 14, pull-down transistors 16 and 18, and access transistors 20 and 22. These six transistors constitute a set of flip-flops. Pull-up transistors 12, 14 and pull-down transistors 16, 18 constitute a latch that stores data in the storage node 24, 26. Because the pull-up transistors 12, 14 act as power load devices they can be replaced by resistors. At this point, the static random access memory is a four-transistors SRAM (4T-SRAM).

Generally speaking, the pull-up transistors 12, 14 of the 6T-SRAM cell 10 comprise p-type metal oxide semiconductor (PMOS) transistors. The pull-down transistors 16, 18 and the access transistors 20, 22 comprise n-type metal oxide semiconductor (NMOS) transistor. The pull-up transistor 12 and the pull-down transistor 16 constitute an inverter, and a series circuit 28. One end of the series circuit 28 is connected to a power supply 32 and the other end of the series circuit 28 is connected to a ground 34. Equally, the pull-up transistor 14 and the pull-down transistor 18 constitute another inverter and a series circuit 30. One end of the series circuit 30 is connected to the power supply 32 and the other end of the series circuit 30 is connected to the ground 34.

Additionally, the storage node 24 is connected to the respective gates of the pull-down transistor 18 and the pull-up transistor 14. The storage node 24 is also connected to the drains of the pull-down transistor 16, pull-up transistor 12 and the access transistor 20. Equally, the storage node 26 is connected to the respective gates of the pull-down transistor 16 and the pull-up transistor 12. The storage node 26 is also connected to the drains of the pull-down transistor 18, pull-up transistor 14 and the access transistor 22. The gates of the access transistors 20 and 22 are respectively coupled to a word line 36, and the sources are coupled to a relative data line 38.

The aggressive scaling of MOS transistors faces severe challenges to the effective capacitance, which is usually expressed as dielectric inversion thickness (Tox_INV). When a gate dielectric layer is in an inversion condition, the gate possesses less carrier mobility than metal materials, thus causing lower effective capacitance. There are two primary methods for improving the effective capacitance. One is to improve the property of the gate dielectric layer, such as using high-K materials or decreasing the thickness of the gate dielectric layer. The other one is to decrease the depletion region of the gate, such as doping atoms or implanting ions on the polysilicon gate to improve the carrier mobility.

A common technique used in industry today for effectively decreasing the Tox_INV involves conducting p-type and n-type polysilicon doping process after a gate conductive layer is deposited in the p-type and n-type transistor region. As the inverter structure disclosed in the aforementioned 6T-SRAM typically includes a polysilicon gate shared between the PMOS transistor and the NMOS transistor, problem such as dopant diffusion often arise and increases the random single bit (RSB) failure rate in the memory array.

It would thus be highly desirable to provide a method for fabricating an embedded SRAM with improved RSB failure rate.

SUMMARY OF THE INVENTION

It is an objective of the present invention to fabricate an inverter structure for solving the problem of mixing n-type dopants and p-type dopants while fabricating the inverter of a conventional 6T-SRAM.

According to a preferred embodiment of the present invention, an inverter structure is disclosed, in which the inverter includes an NMOS transistor having a n-type gate electrode and a n-type source/drain region; a PMOS transistor having a p-type gate electrode and a p-type source/drain region, in which the n-type gate electrode and the p-type gate electrode are physically separated and electrically connected by a conductive contact.

Another aspect of the present invention discloses a method for fabricating an inverter. The method includes the steps of: providing a semiconductor substrate; forming a patterned gate electrode layer on the semiconductor substrate; forming a slot in the patterned gate electrode layer for separating the patterned polysilicon layer into two parts; implanting n-type dopants into one part of the gate electrode layer for forming a n-type gate electrode; implanting p-type dopants into the other part of the gate electrode layer for forming a p-type gate electrode; and filling the slot with a conductive material to electrically connect the n-type gate electrode and the p-type gate electrode.

The present invention first uses two photo-etching processes to form a patterned polysilicon layer on the semiconductor substrate and fabricates a slot in the patterned polysilicon layer to physically separate the NMOS transistor and PMOS transistor of an inverter structure. Next, a dielectric layer is deposited on the NMOS transistor and PMOS transistor and a via hole and metal-interconnecting process is conducted to form via holes in the dielectric layer and deposit conductive material into the via hole to form a conductive contact electrically connecting the NMOS transistor and PMOS transistor disposed on two adjacent sides of the conductive contact. As the polysilicon gate shared between the PMOS transistor 96 and the NMOS transistor 98 is physically separated by the slot, problem such as mixing of n-type dopants and p-type dopants resulted in the conventional technique is effectively prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
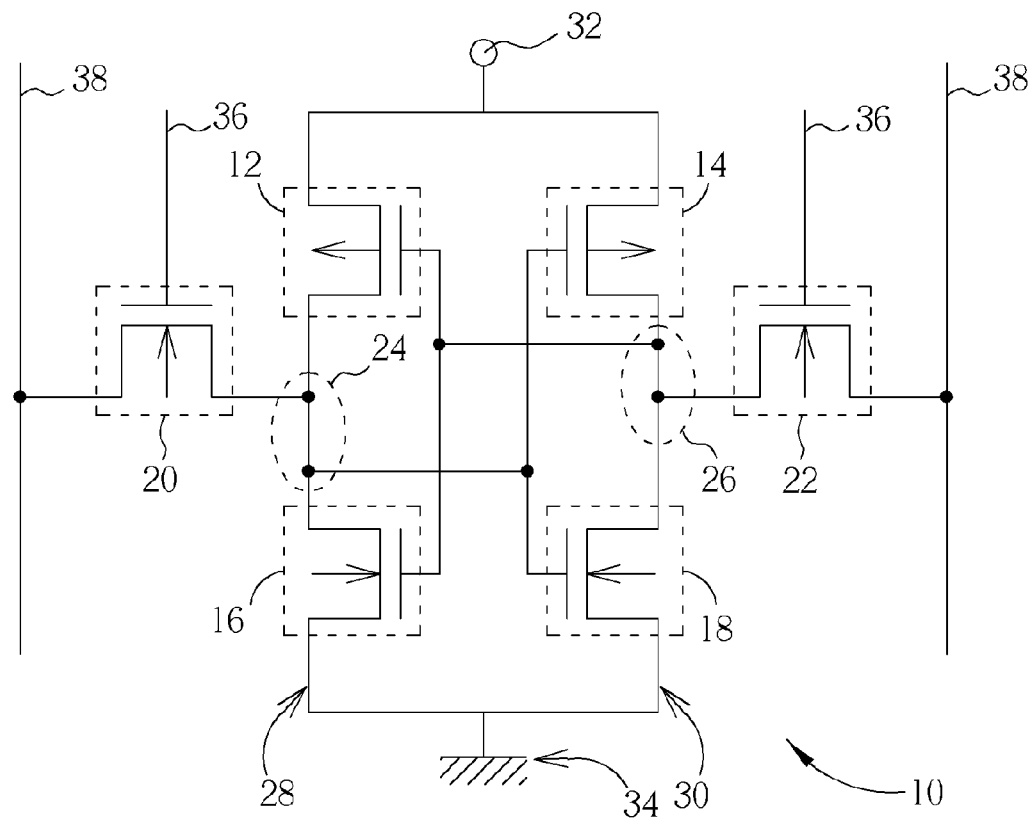
FIG. 1 is a circuit diagram of a 6T-SRAM according to the prior art.
Figure 2:
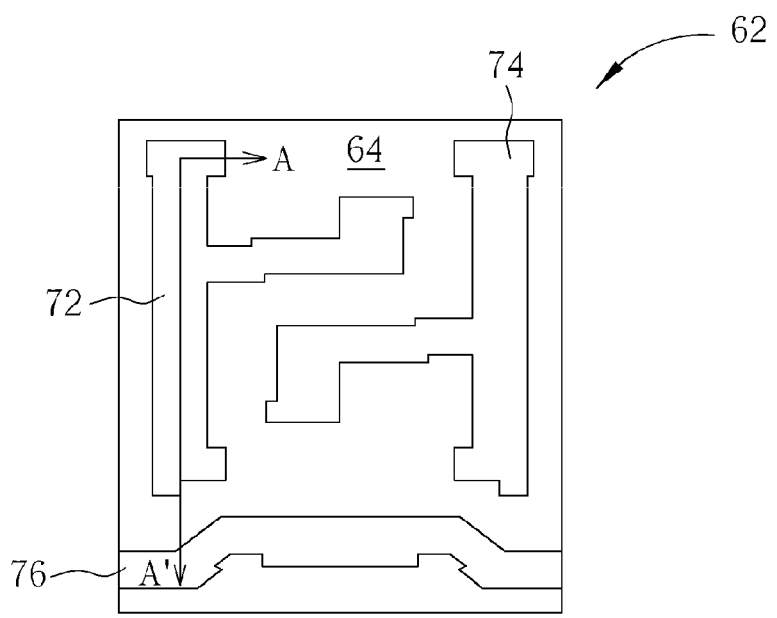
FIG. 2 illustrates a layout diagram of a 6T-SRAM according to a preferred embodiment of the present invention.
Figure 3:
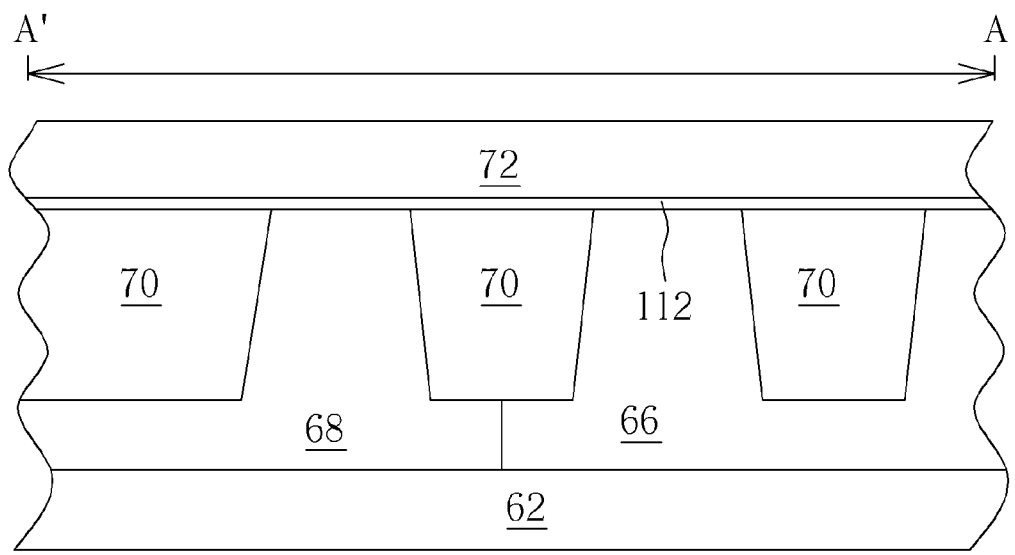
FIG. 3 illustrates a cross-sectional view of FIG. 2 along the sectional line AA'.
Figure 4:
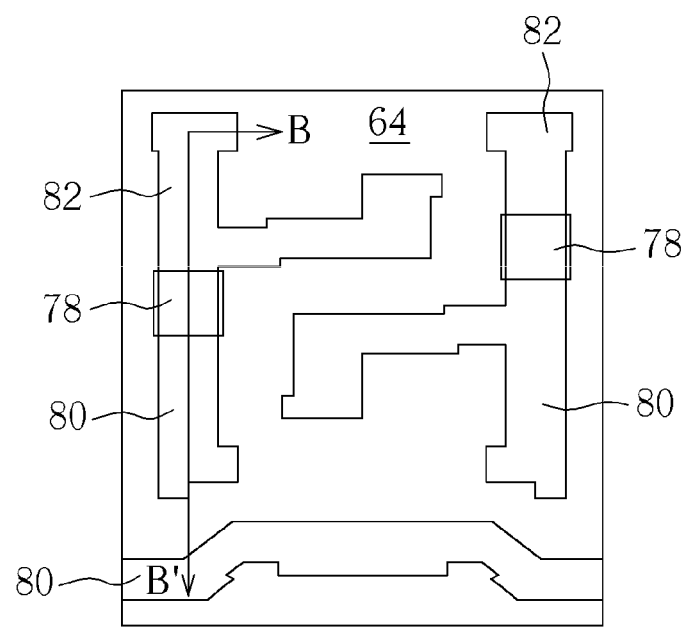
FIG. 4 illustrates a layout diagram of a 6T-SRAM according to a preferred embodiment of the present invention.
Figure 5:
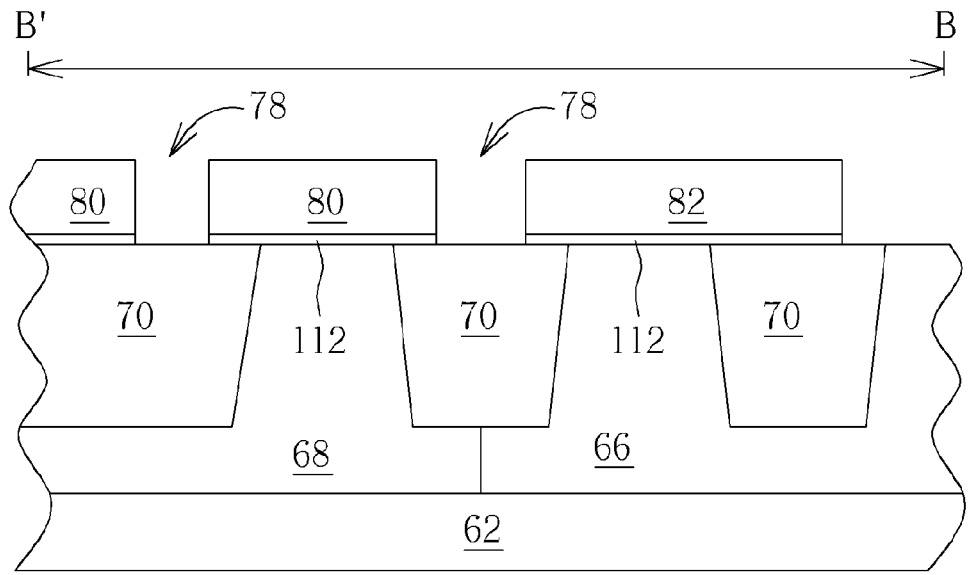
FIG. 5 illustrates a cross-sectional view of FIG. 4 along the sectional line BB'.
Figure 6:
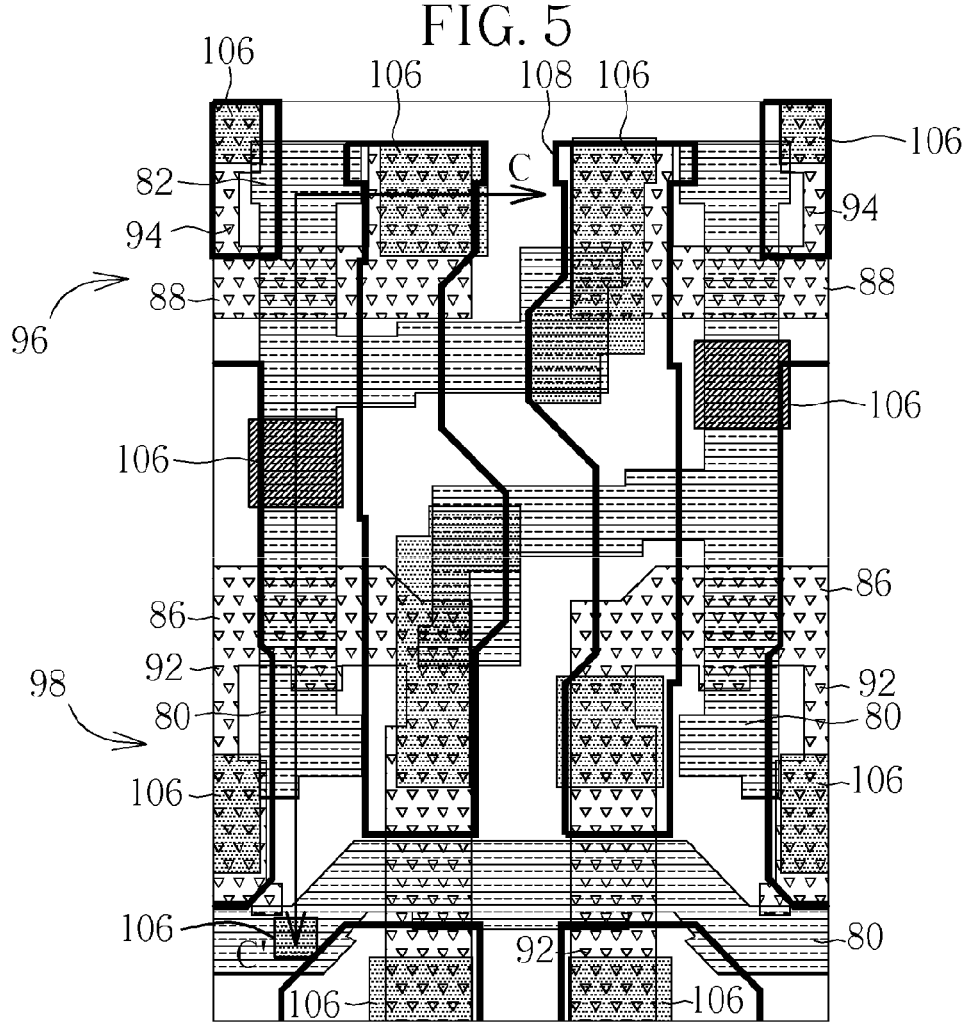
FIG. 6 illustrates a layout diagram of a 6T-SRAM according to a preferred embodiment of the present invention.
Figure 7:
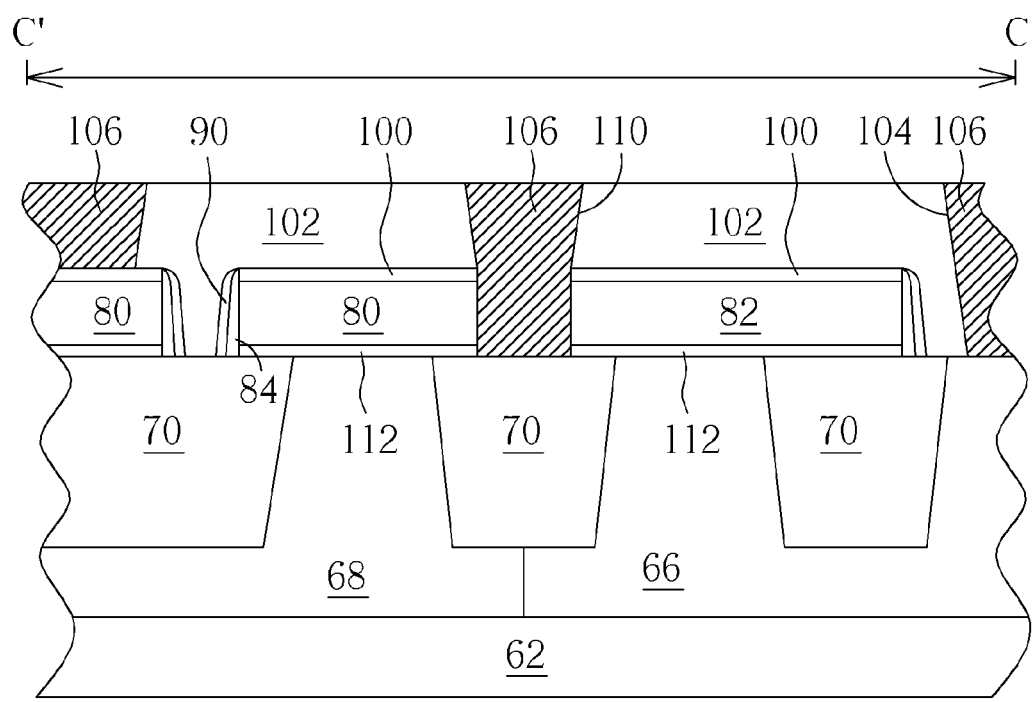
FIG. 7 illustrates a cross-sectional view of FIG. 6 along the sectional line CC'.

Referring to FIGS. 2-7, FIGS. 2, 4, 6 illustrate a layout diagram of a 6T-SRAM according to a preferred embodiment of the present invention, and FIGS. 3, 5, 7 are cross-sectional views of FIGS. 2, 4, 6 along the sectional lines AA', BB', CC'. As shown in FIGS. 2 and 3, a semiconductor substrate 62 is provided and a memory cell area 64 and a logic area (not shown) are defined on the semiconductor substrate 62. A plurality of shallow trench isolations (STIs) are formed to define a plurality of active regions (not shown) and n-wells 66 and p-wells 68 are formed in the memory cell area 64 and logic area of the semiconductor substrate 62 respectively. For instance, a plurality of ion implantations and shallow trench isolation processes could be conducted to form a plurality of n-wells 66, p-wells 68, and shallow trench isolations 70.

Next, a dielectric layer (not shown) composed of oxides or nitrides and a polysilicon layer (not shown) are deposited on the surface of the semiconductor substrate 62, and a photo-etching process is conducted on the dielectric layer and the polysilicon layer thereafter. For instance, a patterned photoresist (not shown) is formed on the surface of the polysilicon layer, and a single or multiple etching process is conducted by using the patterned photoresist as mask to remove a portion of the dielectric layer and the polysilicon layer for forming a plurality of patterned gate dielectric layers 112 and polysilicon layers 72, 74, 76. The patterned photoresist is stripped thereafter. Each of the patterned polysilicon layers 72, 74 preferably defines a gate pattern of the inverter structures of a 6T-SRAM memory unit.

As shown in FIGS. 4-5, another photo-etching process is conducted to form a slot 78 in the patterned polysilicon layers 72, 74. For instance, another patterned photoresist (not shown) could be formed on the patterned polysilicon layers 72, 74, and an etching process is conducted by using the patterned photoresist as mask to form a slot 78 in each of the polysilicon layers 72, 74. The slots 78 preferably separate each of the polysilicon layers 72, 74 into two parts, and the patterned photoresist is removed thereafter. Despite two photo-etching process are used to form the slots 78 and the gate pattern of the inverter structure, it should be noted that only one photo-etching process could also be conducted to simultaneously form the slots 78 and define the gate pattern of the inverter structure, which is also within the scope of the present invention.

Next, an n-type ion implantation and p-type ion implantation are performed to form a plurality of n-type gate electrodes and p-type gate electrodes. For instance, a patterned photoresist (not shown) could be formed on the n-well 66, and an n-type ion implantation is conducted by using this patterned photoresist as mask to implant n-type dopants such as phosphorus or arsenic into the polysilicon layers 72, 74, 76 disposed above the p-well 68, thereby forming a plurality of n-type gate electrodes 80. After stripping the patterned photoresist, another patterned photoresist is disposed on the p-well 68 and p-type dopants such as boron are implanted into the patterned polysilicon layers 72, 74 disposed above the n-well 66 to form a plurality of p-type gate electrodes 82.

As shown in FIGS. 6-7, an offset spacer fabrication is conducted after the n-type gate electrodes 80 and p-type gate electrodes 82 are formed. For instance, a silicon oxide layer or a silicon nitride layer could be deposited and etched back on the sidewall of the n-type gate electrodes 80 and the p-type gate electrodes 82 to form an offset spacer 84. An ion implantation is then conducted by using the gate electrodes 80, 82 and the offset spacer 84 as a mask to form an n-type lightly doped drain 86 and a p-type lightly doped drain 88 in the semiconductor substrate 62 adjacent to two sides of the offset spacers 84, such as the region immediately adjacent to the gate electrodes 80, 82 and illustrated by reverse triangular patterns in FIG. 6. A main spacer formation is performed thereafter by depositing and etching back a silicon oxide layer or a silicon nitride layer to form a main spacer 90 around the offset spacer 84. Next, another ion implantation is conducted by using the gate electrodes 80, 82 and the main spacer 90 as mask to form an n-type source/drain region 92 and a p-type source/drain region 94 in the semiconductor substrate 62 adjacent to two sides of the main spacer 90, such as the doping region extending from the lightly doped drains 86, 88 and illustrated by reverse triangular patterns in FIG. 6. This completes the fabrication of a PMOS transistor 96 and an NMOS transistor 98 on the semiconductor substrate 62, in which the PMOS transistor 96 and the NMOS transistor 98 are physically separated by the slot 78.

It should be noted the aforementioned embodiment specifically uses the first photo-etching process to define the polysilicon pattern of the inverter structure of the 6T-SRAM and uses the second photo-etching process to form a slot 78 between the cross region of the PMOS transistor 96 and the NMOS transistor 98 for physically separating the PMOS transistor 96 and the NMOS transistor 98. In other words, as the polysilicon gate shared between the PMOS transistor 96 and the NMOS transistor 98 is physically separated by the slot 78, problem such as mixing of n-type dopants and p-type dopants caused in the conventional technique is effectively prevented.

It should also be noted in addition to the order for forming the offset spacer 84, the lightly doped drains 86, 88, the main spacer 90, and the source/drain regions 92 and 94, the number of the spacers and the order for forming these doping regions and spacers could also be adjusted according to the demand of the product, which are all within the scope of the present invention.

After the source/drain regions 92, 94 are formed, a salicide process is performed by first depositing a metal layer (not shown) composed of cobalt, titanium, nickel, platinum, palladium, or molybdenum over the surface of the substrate 62, and a rapid thermal annealing process is conducted to form a silicide 100 on top of the gate electrodes 80, 82 and at two sides of the spacer 90. Un-reacted metal layer remained from the salicide process is removed thereafter.

Next, a dielectric layer 102 composed silicon nitride, silicon oxide, or composite dielectric material is deposited on the n-type gate electrode 80, the p-type gate electrode 82, the main spacer 90, and the source/drain regions 92, 94. A contact hole fabrication is conducted thereafter by first forming a patterned photoresist (not shown) on the dielectric layer 102 and performing an etching process by using the patterned photoresist as mask to remove a portion of the dielectric layer 102 and a portion of the main spacer 90 and offset spacer 84 disposed between the n-type gate electrode 80 and p-type gate electrode 82 thereby forming a plurality of contact holes 104, 110 in the dielectric layer 102. Preferably, the opening of the aforementioned patterned photoresist is controlled at a size relatively larger than the size of the slot 78, such that the main spacer 84 and offset spacer 84 disposed between the n-type gate electrode 80 and the p-type gate electrode 82 could be completely removed during the etching process. The contact hole 110 preferably connects the slot 78 formed in the polysilicon layers 72, 74, and the contact hole 104 preferably exposes the surface of the source/drain region 94. A conductive material 106 (such as the dotted blocks shown in FIG. 6) composed of titanium nitride, titanium, tantalum nitride, tantalum, tungsten, copper or combination thereof is then deposited in the contact holes 104, 110 for electrically connecting the n-type gate electrode 80 and p-type gate electrode 82 adjacent to the conductive material 106. A metal-interconnecting process is conducted thereafter to form a plurality of dielectric layers (not shown) and wires 108 on top of the dielectric 102, thereby completing the fabrication of a 6T-SRAM.

Overall, the present invention first uses two photo-etching processes to form a patterned polysilicon layer on the semiconductor substrate and fabricates a slot in the patterned polysilicon layer to physically separate the NMOS transistor and PMOS transistor of an inverter structure. Next, a dielectric layer is deposited on the NMOS transistor and PMOS transistor and a via hole and metal-interconnecting process is conducted to form via holes in the dielectric layer and deposit conductive material into the via hole to form a conductive contact electrically connecting the NMOS transistor and PMOS transistor disposed on two adjacent sides of the conductive contact. As the polysilicon gate shared between the PMOS transistor 96 and the NMOS transistor 98 is physically separated by the slot, problem such as mixing of n-type dopants and p-type dopants resulted in the conventional technique is effectively prevented.

Those skilled in the art will readily observe that numerous modifications and alterations of the device and method may be made while retaining the teachings of the invention.

What is claimed is:

1. A CMOS structure, comprising:
   a substrate having a shallow trench isolation (STI);
   an NMOS transistor, comprising a n-type gate electrode and a n-type source/drain region;
   a PMOS transistor, comprising a p-type gate electrode and a p-type source/drain region, wherein the n-type gate electrode and the p-type gate electrode are physically separated and aligned according to a direction along the channel widths of the n-type gate electrode and the p-type gate electrode; and
   a single conductive contact being sandwiched in between the n-type gate electrode and the p-type gate electrode, and electrically connecting the n-type gate electrode and the p-type gate electrode, wherein the single conductive contact comprises metal, metal nitride or a combination thereof, the single conductive contact is wider at a top than a bottom thereof, and the bottom of the single conductive contact is in physical contact with the STI.

2. The CMOS structure of claim 1, wherein the CMOS structure is a portion of a SRAM device.

3. The CMOS structure of claim 1, wherein the conductive contact comprises titanium nitride, tantalum nitride, tungsten, titanium, tantalum, copper, or combination thereof.

4. The CMOS structure of claim 1, further comprising a spacer disposed around each of the n-type gate electrode and the p-type gate electrode.

5. A CMOS structure, comprising:
   a substrate having a shallow trench isolation (STI);
   an NMOS transistor, comprising a n-type gate electrode and a n-type source/drain region;
   a PMOS transistor, comprising a p-type gate electrode and a p-type source/drain region, wherein the n-type gate electrode and the p-type gate electrode are physically separated and aligned according to a direction along the channel widths of the n-type gate electrode and the p-type gate electrode; and
   a single conductive contact being sandwiched in between the n-type gate electrode and the p-type gate electrode, and electrically connecting the n-type gate electrode and the p-type gate electrode, wherein the single conductive contact extends above top surfaces of the n-type gate electrode and the p-type gate electrode, respectively, and a bottom of the single conductive contact is in physical contact with the STI.

6. The CMOS structure of claim 5, wherein the CMOS structure is a portion of a SRAM device.

7. The CMOS structure of claim 5, wherein the conductive contact comprises titanium nitride, tantalum nitride, tungsten, titanium, tantalum, copper, or combination thereof.

8. The CMOS structure of claim 5, further comprising a spacer disposed around each of the n-type gate electrode and the p-type gate electrode.

* * * * *